(12) United States Patent
Park et al.

(10) Patent No.: US 10,388,367 B2
(45) Date of Patent: *Aug. 20, 2019

(54) NONVOLATILE MEMORY DEVICE WITH CONTROLLED WORD LINE SETUP TIME

(71) Applicant: SAMSUNG ELECTRONICS CO., LTD., Suwon-si, Gyeonggi-Do (KR)

(72) Inventors: Sang-Won Park, Seoul (KR); Dongkyo Shim, Seoul (KR); Kitae Park, Seongnam-si (KR); Sang-Won Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 19 days.

This patent is subject to a terminal disclaimer.

(21) Appl. No.: 15/351,552

(22) Filed: Nov. 15, 2016

(65) Prior Publication Data
US 2017/0062046 A1 Mar. 2, 2017

Related U.S. Application Data

(63) Continuation of application No. 14/322,335, filed on Jul. 2, 2014, now Pat. No. 9,502,124.

(30) Foreign Application Priority Data

Sep. 16, 2013 (KR) ........................ 10-2013-0111390

(51) Int. Cl.
G11C 8/08 (2006.01)
G11C 11/56 (2006.01)
G11C 16/04 (2006.01)
G11C 16/08 (2006.01)
G11C 16/26 (2006.01)
G11C 16/34 (2006.01)
G11C 29/02 (2006.01)

(52) U.S. Cl.
CPC ............ *G11C 11/5642* (2013.01); *G11C 8/08* (2013.01); *G11C 11/5628* (2013.01); *G11C 16/0483* (2013.01); *G11C 16/08* (2013.01); *G11C 16/26* (2013.01); *G11C 16/3459* (2013.01); *G11C 29/021* (2013.01); *G11C 29/028* (2013.01)

(58) Field of Classification Search
None
See application file for complete search history.

(56) References Cited

U.S. PATENT DOCUMENTS

| 5,696,730 | A | 12/1997 | Slezak et al. |
| 7,372,730 | B2 | 5/2008 | Chen |
| 7,405,977 | B2 | 7/2008 | Lee et al. |
| 8,031,530 | B2 | 10/2011 | Joo |
| 8,085,600 | B2 | 12/2011 | Kang |
| 8,154,923 | B2 | 4/2012 | Li et al. |
| 8,203,888 | B2 | 6/2012 | Fukuda et al. |
| 8,363,466 | B2 | 1/2013 | Shinozaki et al. |

(Continued)

Primary Examiner — J. H. Hur
(74) Attorney, Agent, or Firm — Volentine, Whitt & Francos, PLLC

(57) ABSTRACT

A nonvolatile memory device includes a voltage generator that sequentially provides a first setup voltage and second setup voltage to a word line of a memory cell array, and control logic including a time control unit that determines a word line setup time for the word line in relation to the second setup voltage based on a difference between the first and second setup voltages.

9 Claims, 18 Drawing Sheets

(56) References Cited

U.S. PATENT DOCUMENTS

| | | |
|---|---|---|
| 8,385,130 B2 | 2/2013 | Shibata et al. |
| 9,502,124 B2 * | 11/2016 | Park .................. G11C 16/26 |
| 2003/0021152 A1 * | 1/2003 | Le ...................... G11C 8/08 |
| | | 365/185.18 |
| 2004/0196093 A1 * | 10/2004 | Le ...................... G11C 5/145 |
| | | 327/536 |
| 2006/0126392 A1 * | 6/2006 | Shibata ............ G11C 16/3404 |
| | | 365/185.22 |
| 2006/0209592 A1 * | 9/2006 | Li .................... G11C 11/5642 |
| | | 365/185.03 |
| 2007/0097759 A1 | 5/2007 | Chen |
| 2008/0013378 A1 * | 1/2008 | Crippa .............. G11C 11/5628 |
| | | 365/185.17 |
| 2008/0137460 A1 * | 6/2008 | Incarnati ............ G11C 5/143 |
| | | 365/212 |
| 2008/0181032 A1 | 7/2008 | Yu |
| 2009/0052256 A1 * | 2/2009 | Sutardja .............. G11C 8/08 |
| | | 365/185.19 |
| 2009/0296487 A1 | 12/2009 | Murin et al. |
| 2010/0135078 A1 * | 6/2010 | Iwai .................. G11C 11/5642 |
| | | 365/185.03 |
| 2011/0007590 A1 | 1/2011 | Katayama |
| 2012/0008389 A1 | 1/2012 | Kim |
| 2012/0120729 A1 * | 5/2012 | Yuh .................. G11C 11/5628 |
| | | 365/185.19 |
| 2012/0224426 A1 | 9/2012 | Nam et al. |

* cited by examiner

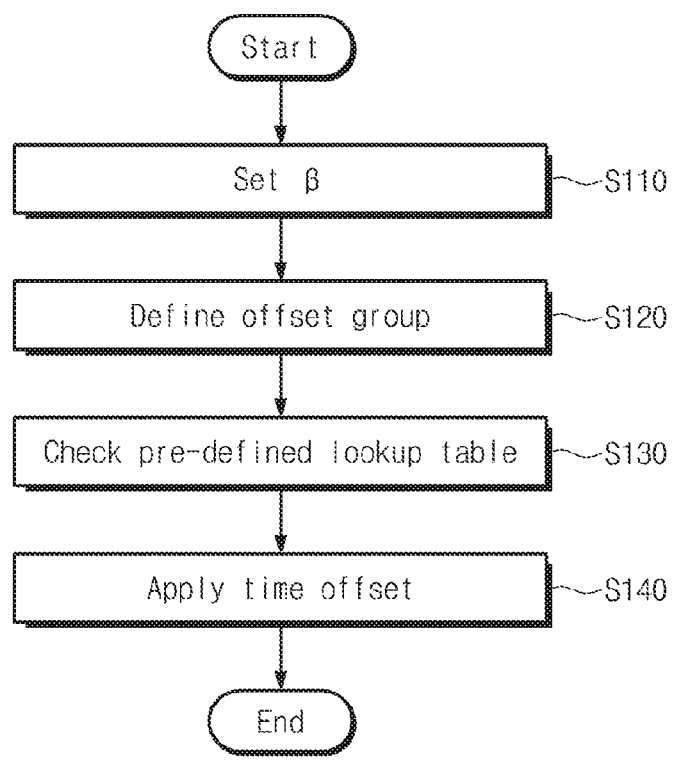

NONVOLATILE MEMORY DEVICE WITH CONTROLLED WORD LINE SETUP TIME

CROSS-REFERENCE TO RELATED APPLICATIONS

This is a Continuation of U.S. patent application Ser. No. 14/322,335 filed Jul. 2, 2014, in which a claim for priority under 35 U.S.C. § 119 is made to Korean Patent Application No. 10-2013-0111390 filed Sep. 16, 2013, the subject matter of both of which are hereby incorporated by reference.

BACKGROUND

The inventive concept relates generally to semiconductor memory devices, and more particularly, a nonvolatile memory device and an operating method for same.

Semiconductor memory devices may be classified as volatile memory devices such as DRAM and SRAM, and nonvolatile memory devices such as EEPROM, FRAM, PRAM, MRAM, flash memory, and the like. Unlike volatile memory devices, nonvolatile memory devices are able to retain stored data in the absence of applied power. Flash memory is a particularly popular type of nonvolatile memory as it provides fast programming speed, low power consumption, and large amounts of data storage.

A flash memory device may include memory cells configured to operate as single-level memory cells (SLC) capable of storing binary data, and/or multi-level memory cells capable of storing 2 or more bits of data per memory cell.

The additional data storage capacity provided by MLC flash memory comes at some operational burden. For example, it is important to secure adequate read margins between adjacent program states in a MLC flash memory device. However, MLC threshold voltages in flash memory device will vary due to various causes such as coupling noise, pass voltage disturbance, program voltage disturbance, and the like.

SUMMARY

In one embodiment, the inventive concept provides a nonvolatile memory device including a voltage generator configured to sequentially provide a first setup voltage and a second setup voltage to a word line of a memory cell array, and a control logic including a time control unit configured to determine a word line setup time for the word line in relation to the second setup voltage based on a difference between the first and second setup voltages.

In another embodiment, the inventive concept provides an operating method for a nonvolatile memory device, including; during a read operation, providing a first read voltage to a word line, and providing a second read voltage to the word line, and thereafter, determining a word line setup time for the second setup voltage based on a difference between the first and second read voltages.

In still another embodiment, the inventive concept provides an operating method for a nonvolatile memory device, including; during a program operation, providing a first verification voltage to a word line and providing a second verification voltage to the word line after providing the first verification voltage, and determining a word line setup time for the second verification voltage based on a difference between the first and second verification voltages.

BRIEF DESCRIPTION OF THE DRAWINGS

The above and other objects and features will become apparent from the following description with reference to the following figures, wherein like reference numerals refer to like parts throughout the various figures unless otherwise specified, and wherein

FIG. 13 is a flow chart summarizing a method of determining a word line setup time for a verification voltage according to an embodiment of the inventive concept;

FIG. 14 is a diagram illustrating in one example a lookup table that may be used in determining a word line setup time for a verification voltage according to certain embodiments of the inventive concept;

DETAILED DESCRIPTION

Figure 1:
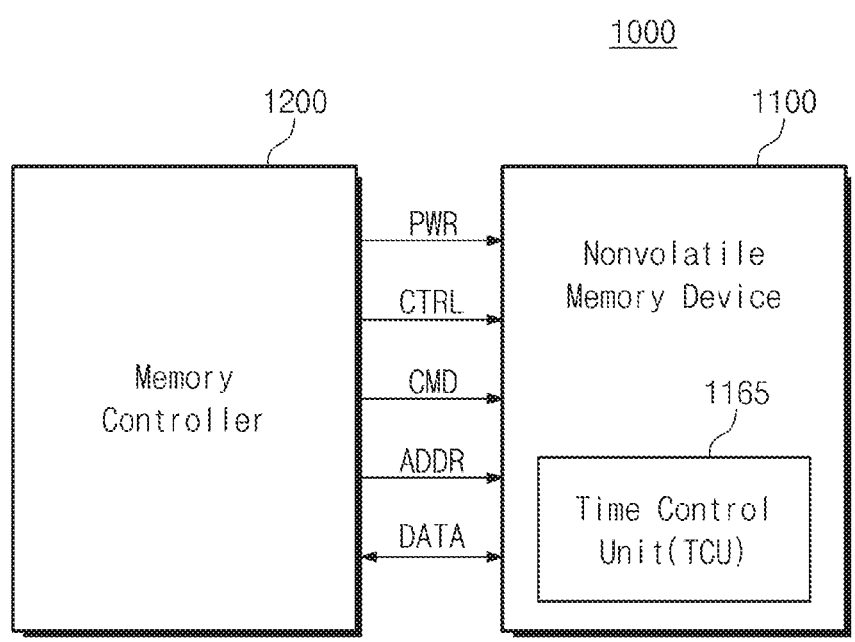
FIG. 1 is a block diagram illustrating a nonvolatile memory system according to an embodiment of the inventive concept.

Embodiments of the inventive concept will now be described in some additional detail with reference to the accompanying drawings. The inventive concept, however, may be embodied in various different forms, and should not be construed as being limited to only the illustrated embodiments. Rather, these embodiments are provided as examples so that this disclosure will be thorough and complete, and will fully convey the concept of the inventive concept to those skilled in the art. Unless otherwise noted, like reference numbers and labels denote like or similar elements throughout the drawings and written description.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure (FIG. 1 is a block diagram generally illustrating a nonvolatile memory system according to an embodiment of the inventive concept. Referring to FIG. 1, a nonvolatile memory system 1000 comprises a nonvolatile memory device 1100 and a memory controller 1200. The nonvolatile memory system 1000 may include a flash memory based data storage medium such as a memory card, an USB memory, a solid state drive (SSD), and the like.

The nonvolatile memory device 1100 performs operations including an erase operation, a write operation, and a read operation under the control of the memory controller 1200. In performing these and other operations, the nonvolatile memory device 1100 receives from the memory controller one or more command(s) CMD, address(es) ADDR, and/or related data via a number of input/output (I/O) lines that may be arranged in one or more bus configurations. The nonvolatile memory device 1100 also receives one or more power signals PWR via power line(s) and one or more control signal(s) CTRL via control line(s). Conventionally understood control signals include, as examples, the command latch enable CLE, address latch enable ALE, chip enable nCE, write enable new, and read enable nRE.

As shown in FIG. 1, the nonvolatile memory device 1100 also comprises a time control unit 1165. The time control unit 1165 may be configured to determine a setup time for one or more setup voltage(s) respectively applied to a word line. A "setup voltage" applied to a word line according to aspects of the inventive concept may take many different forms, as deemed prudent by a memory system designer. For example, a particular setup voltage may be similar in nature to a read voltage, a verification voltage, or a program voltage that is normally used during execution of one or more operations.

The time control unit 1165 may be used to change a "word line setup time" of a read voltage in view of a program state ordering for the nonvolatile memory device 1100. That is, in certain embodiments of the inventive concept, the time control unit 1165 may be used to determine a word line setup time based on a difference between a "first read voltage" applied to the word line and a "second read voltage" subsequently applied to the word line. Alternately or additionally, the time control unit 1165 may be used to determine a word line setup time of a one or more verification voltage(s) provided to a word line in view of pass/fail responses of memory cells in relation to the verification voltage(s).

In regard to either of these two exemplary approaches, the time control unit 1165 may also be used to determine a time for providing the read voltage(s) or verification voltage(s) according to a physical location of the word line within the constituent memory cell array. Understanding the setup time for a particular word line is highly informative. For example, word line setup time metrics may be used to identify defective word lines, or a number of defective memory cells associated with a word line. Compensating solutions may be put into effect to thereby reduce the time required for the nonvolatile memory device 1100 to perform read and/or verification operation(s).

Figure 2:
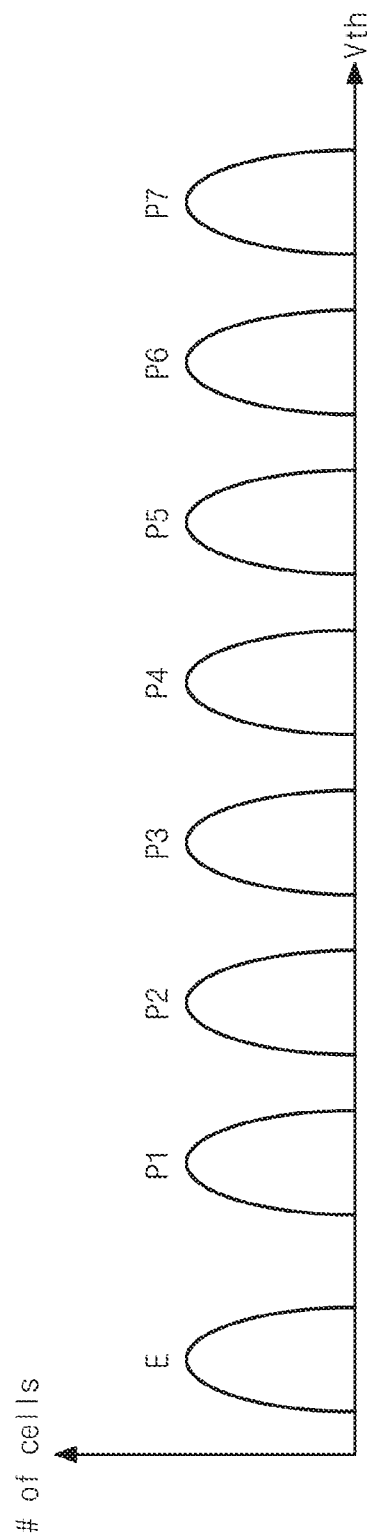
FIG. 2 is a diagram illustrating threshold voltage distributions corresponding to program and erase states for a 3-bit MLC.

FIG. 2 is a diagram illustrating threshold voltage distributions corresponding to the erase state and multiple program states of a nonvolatile memory cell configured to operate as a 3-bit multi-level cell (MLC). Threshold voltages for memory cells programmed to a same program state corresponding to a same data value will inevitably form a range of threshold voltage distribution due to characteristic differences between the memory cells. In a flash memory configured with MLC, assuming k-bit data is programmed to each constituent memory cell, each memory cell may be programmed to have a threshold voltage that falls within one of the $2^k$ threshold voltage distributions. Thus, for the 3-bit MLC (k=3) illustrated in FIG. 2, eight (8) threshold voltage distributions are possible, each respectively corresponding to one of an erased state E and first through seventh program states P1 to P7.

Figure 3:
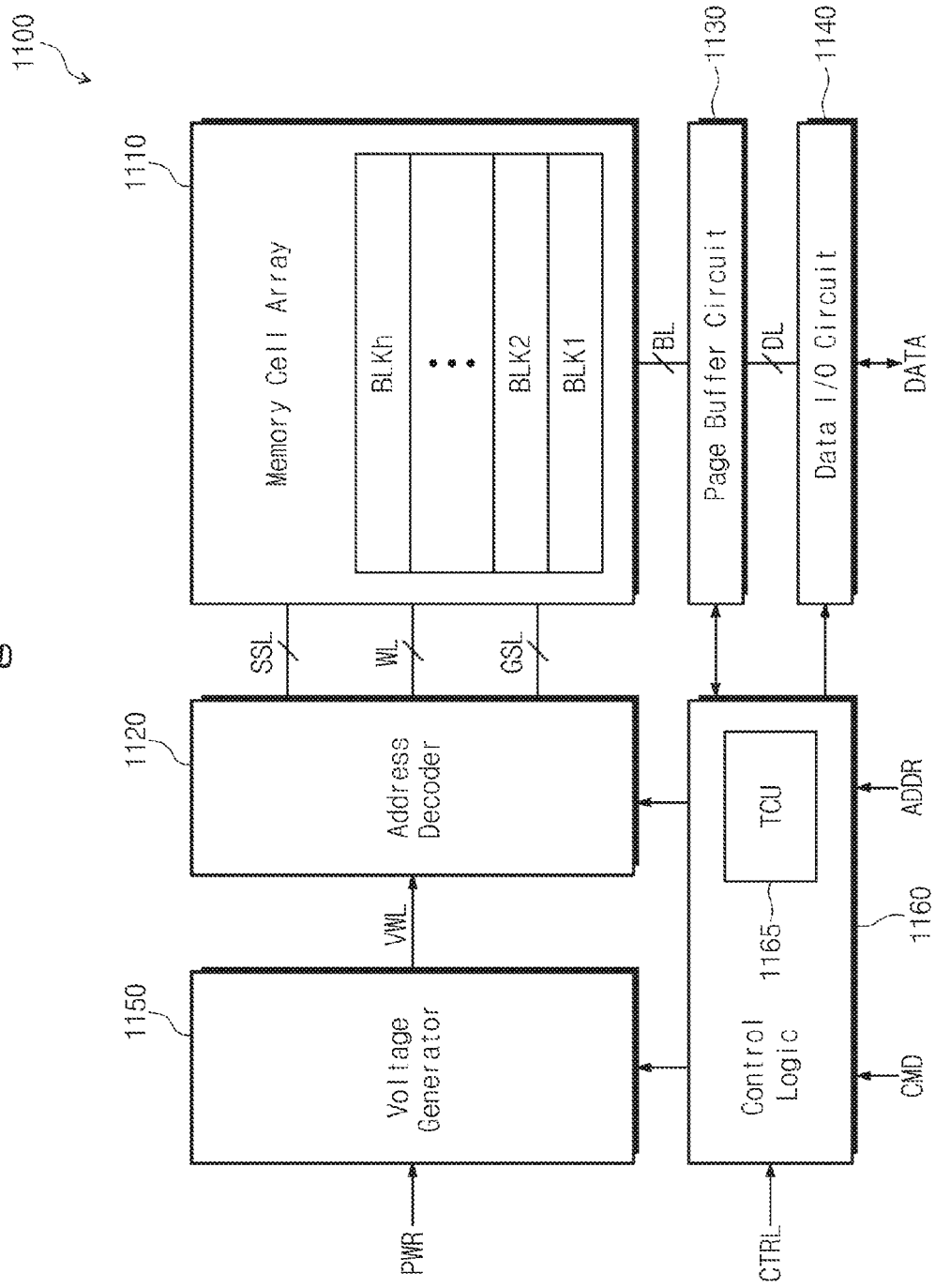
FIG. 3 is a block diagram further illustrating the nonvolatile memory device of FIG. 1.

FIG. 3 is a block diagram further illustrating the nonvolatile memory device 1100 of FIG. 1 according to an embodiment of the inventive concept. Referring to FIG. 3, the nonvolatile memory device 1100 comprises in relevant portion a memory cell array 1110, an address decoder 1120, a page buffer circuit 1130, a data input/output circuit 1140, a voltage generator 1150, and control logic 1160. Here, it is further assumed that control logic 1160 implements the control functionality of the time control unit (TCU) 1165 previously suggested in relation to FIG. 1.

The memory cell array 1110 is functionally divided into a plurality of memory blocks BLK1 to BLKh, each memory block BLK being further divided into a plurality of physical pages. Here, it is assumed for purposed of explanation that each physical page includes a set of memory cells commonly connected to a word line. The memory cell array 1110 may have a two-dimensional or horizontal structure, or a three-dimensional (3D) or vertical structure. In a 3D structure the memory cells of the memory cell array 1110 will be "vertically" stacked in a direction perpendicular to an orientation direction of a principle surface of a constituent substrate.

Where k-bit MLC are arranged in the memory cell array 1110, each MLC will be operationally capable of storing up to k-bits of data (e.g., 3 in the illustrated example of FIG. 2). Thus, assuming a case where 2-bit MLC are arranged in a memory cell array of a nonvolatile memory device, the 2-bit data stored by one (1) physical page of 2-bit MLC may be arranged in two (2) logical pages, wherein each 2-bit MLC has a threshold voltage indicating one of four (4) possible data values (00, 01, 10, and 11). Thus, a "logical page" may be understood as a set of data that is collectively programmed to respective memory cells of a particular physical page at the same time.

Returning to FIG. 3, the address decoder 1120 is connected to the memory cell array 1110 through selection lines SSL and GSL or word lines, and may be used to select a word line corresponding to an input address (ADDR) received during a read or program operation.

The page buffer circuit 1130 is connected to the memory cell array 1110 through bit lines, and may be used to temporarily store "program data" to be programmed to the memory cell array 1110, or "read data" retrieved from a selected page.

The data input/output (I/O) circuit 1140 is connected to the page buffer circuit 1130 through data lines DL, and is also connected to the memory controller 1200 via one or more input/output lines (see, FIG. 1). The data I/O circuit 1140 receives program data from the memory controller 1200 during a program operation, and provides read data to the memory controller 1200 during a read operation.

The voltage generator 1150 is configured to receive one or more power signals (PWR) from the memory controller 1200. In response to the received power signals, the voltage generator 1150 generates a number of control voltages that may be variously applied to the address decoder 1120, page buffer circuit 1130, memory cell array 1110, data I/O circuit 1140, etc. One of these control voltages is the word line voltage VWL that is typically provided from the voltage generator 1150 to the address decoder 1120 during read and program operations. The word line voltage is provided to a particular word line selected from among the plurality of word lines traversing the memory cell array by the address decoder 1120. Other examples of control voltages normally provided by the voltage generator 1150 include program voltage(s), read voltage(s), verification voltage(s), and the like. Any one of these control voltages may be selectively generated by the voltage generator 1150 and thereafter provided to a particular word line of the memory cell array 1110 by operation of the address decoder 1120.

The control logic 1160 may be used to control the execution of program, read, and erase operations by the nonvolatile memory device 1100. Those skilled in the art will recognize that a great many different approaches may be used to effect control over the operation of the nonvolatile memory device 1100 by the control logic 1160. However, in the illustrated example of FIG. 3, the control logic 1160 receives one or more command(s) CMD, together with at least one address ADDR, and one or more control signal(s) CTRL from the memory controller 1200, and in response, the control logic 1160 controls the address decoder 1120 during a program operation to provide the program voltage to a selected word line, and controls the page buffer circuit 1130 and data I/O circuit 1140 to provide program data to a selected page.

Read/verification operations are similarly executed by the nonvolatile memory device 1100 under the control of the control logic 1160. During read/verification operation, the time control unit 1165 may be used to determine a word line setup time in relation to one or more read/verification voltage(s). This word line setup time determination function may be varied in its nature according to various factors. For example, the time control unit 1165 may change a word line setup time in relation to a read voltage based on a program state ordering used by the nonvolatile memory device 1100. Additionally of alternately, the time control unit 1165 may determine a word line setup time in relation to first and second read voltages, and/or the time control unit 1165 may determine a word line setup time in relation to a number of verification voltages provided to a word line based on pass/fail memory cell responses to the verification voltages.

In case where the memory cell array 1110 has a three-dimensional structure, the diameter of a channel hole will vary by physical location along a word line. Given this common physical condition, the time control unit 1165 may be used to determine a word line setup time in relation to a particular "setup voltage" provided to the word line at a given physical location along the word line. In this manner an accurate understanding of word line setup time(s) may be obtained for word lines traversing a 3D memory cell array.

Figure 4:
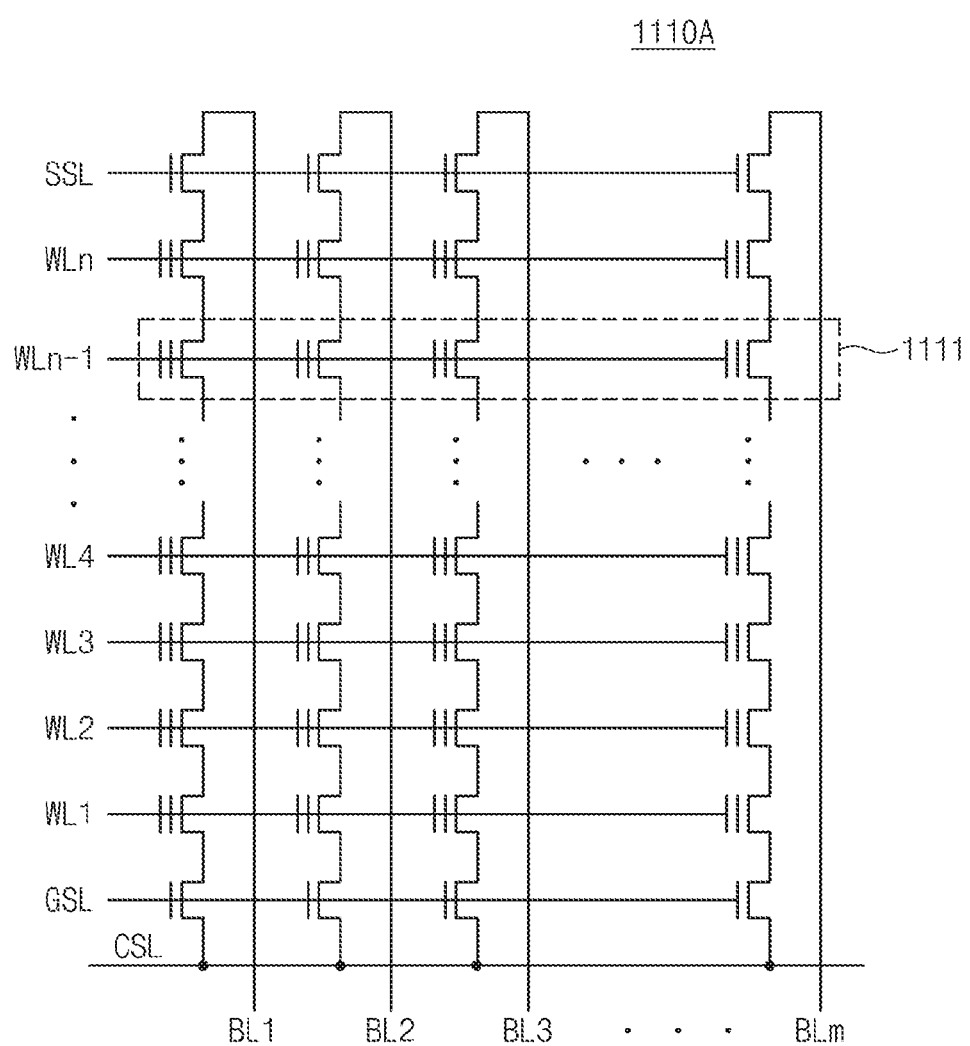
FIG. 4 is a circuit diagram further illustrating in one example the memory cell array of FIG. 3.

FIG. 4 is a circuit diagram further illustrating in one example (1110A) the memory cell array 1110 of FIG. 3 having a two-dimensional structure. Referring to FIGS. 3 and 4, a block of the memory cell array 1110A comprises 'n' word lines. Referring to FIG. 4, a (n−1)th word line WLn−1 (1111) of the n word lines in the memory cell array 1110A is referred to as a first word line, where the first word line is assumed to store a plurality of logical pages.

During a read operation directed to the MLC of the memory cell array 1110A, a plurality of read voltages (each being respectively different from the other read voltages) is provided to the first word line 1111 in accordance with a defined program state ordering. Thus, it is assumed that a first read voltage is provided to the first word line 1111, and then a second read voltage is provided to the first word line 1111. According to certain embodiments of the inventive concept, the time control unit 1165 (see, FIG. 3) may be used to respectively determine a first setup time for the first read voltage and a second setup time for the second read voltage. Thereafter, the time control unit 1165 may determine whether the second setup time was longer or shorter than the first setup time.

Hence, the time control unit 1165 may determine a setup time for a selected word line (here, the first word line 1111) in relation to a difference between the setup times corresponding to the first read voltage and second read voltage. It is assumed in this example that the second read voltage is higher in voltage level than the first read voltage. Accordingly, if a difference between the first and second setup times is larger than a predetermined reference value, then time control unit 1165 may determine that the second setup time is longer than the first setup time. But if the difference between the first and second setup times is smaller than the reference value, time control unit 1165 may determine that the second setup time is shorter than the first setup time.

Referring to FIGS. 2, 3 and 4, during a verification operation, the time control unit 1165 may be used to determine a word line setup time in relation to one or more verification voltage(s). This type of word line setup time determination is based on the pass/fail responses of memory cells programmed to a particular program state (hereafter, pass/fail information).

After executing a program operation, the nonvolatile memory device 1100 of FIGS. 1 and 3 may provide the first word line 1111 of FIG. 4 with a verification voltage corresponding to each program state in order to verify whether or not the data was successfully programmed. Here, the time control unit 1165 may be used to determine one or more word line setup time(s) in relation to one or more verification voltage(s) provided to the word line.

Assuming that MLC connected to the first word line 1111 of the memory cell array 1110 may be programmed according to first, second, third and fourth program states, then it follows that first, second, third and fourth verification voltages will be sequentially applied to the first word line 1111 during a verification operation. (Here, the first program state may be an erased state). If the second and third program states are passed, a pure verification voltage increment β corresponding to the first to fourth program states may be calculated. Accordingly, the time control unit 1165 determines an offset period corresponding to the pure difference value β, and the time control unit 1165 may determine a word line setup time for the first word line 1111 in relation to a verification voltage corresponding to the fourth program state. The nature and determination of the pure verification voltage increment β will be described in some additional detail with reference to FIGS. 11 and 12 hereafter.

Figure 5:
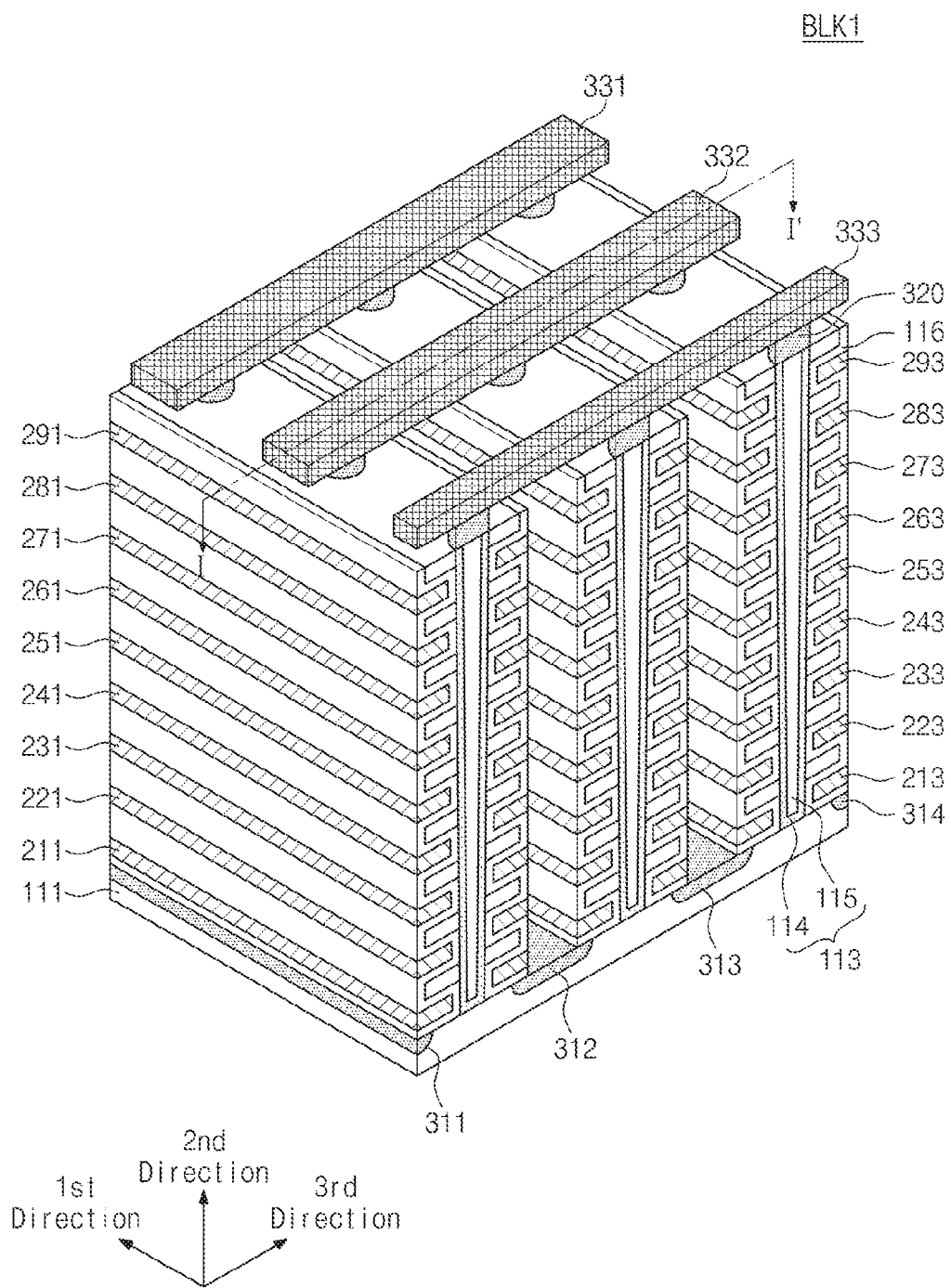
FIGS. 5 and 6 are respective diagrams that illustrate in one example a three-dimensional structure for the memory cell array of FIG. 3.
Figure 6:
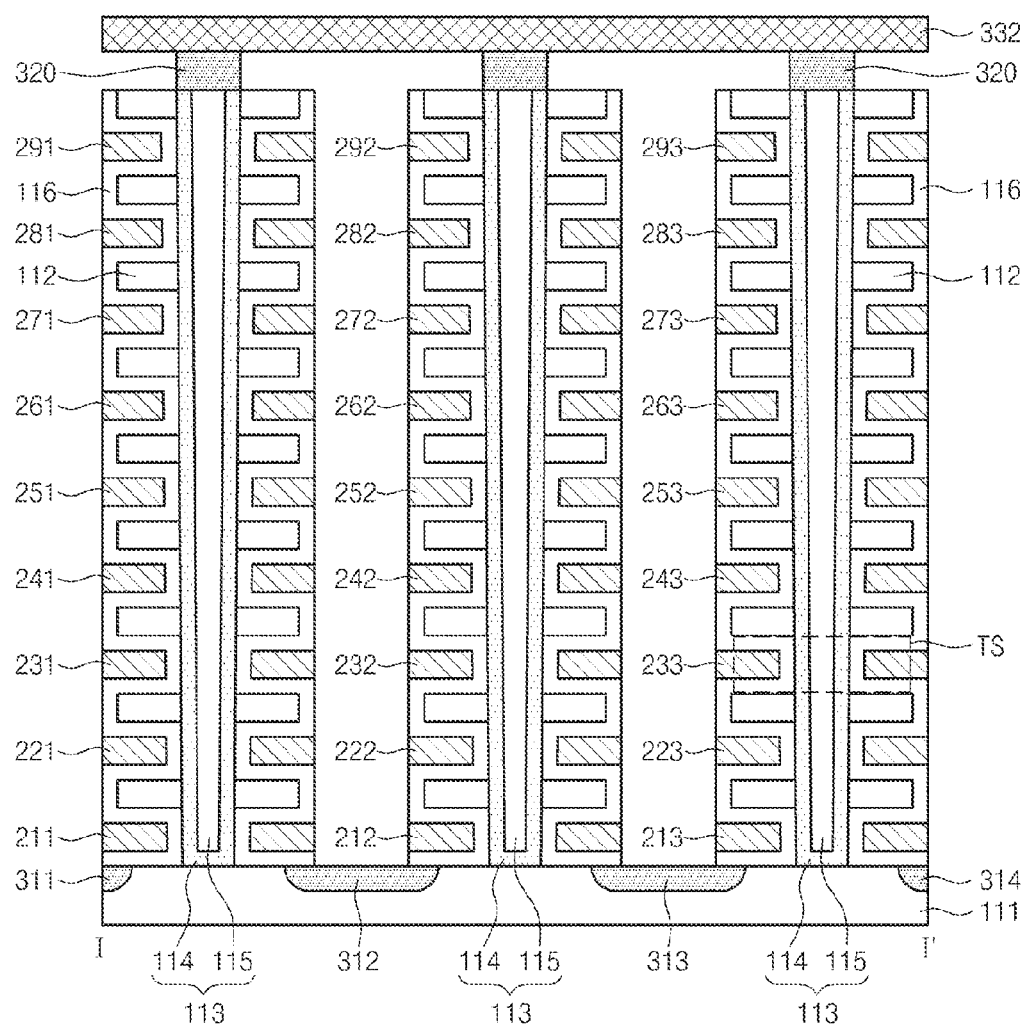

FIGS. 5 and 6 further illustrate in one example a three-dimensional structure for the memory cell array 1110 of FIG. 3 according to an embodiment of the inventive concept. FIG. 5 illustrates a memory block BLK1 from among a plurality of memory blocks BLK1 to BLKh, where memory block BLK1 includes structures extending in first, second and third directions.

The memory block BLK1 comprises a plurality of NAND strings extending along the second direction. A plurality of NAND strings NS may be provided along the first and third directions. Each NAND string NS is connected to a bit line BL (331, 332 or 333), at least one string selection line SSL, at least one ground selection line GSL, a plurality of word lines WL, at least one dummy word line DWL, and a common source line CSL. That is, each memory block may be connected to a plurality of bit lines BL, a plurality of string selection lines SSL, a plurality of ground selection lines GSL, a plurality of word lines WL, a plurality of dummy word lines DWL, and a plurality of common source lines CSL.

FIG. 6 is a cross-sectional view taken along a line I-I' of the memory block BLK1 shown in FIG. 5.

The principle substrate 111 includes a silicon material doped by first type impurity. For example, the substrate 111 may include a silicon material doped by p-type impurity or be a p-type well (e.g., a pocket p-well). The substrate 111 may further include an n-type well surrounding the p-type well. Below, it is assumed that the substrate 111 is p-type silicon. However, the substrate 111 is not limited to the p-type silicon.

A plurality of doping regions 311 to 314 extending along the first direction is provided on the substrate 111. For example, the doping regions 311 to 314 have a second type differing from that of the substrate 111. For example, the plurality of doping regions 311 to 314 may be n-type. Below, it is assumed that the first to fourth doping regions 311 to 314 are n-type. However, the first to fourth doping regions 311 to 314 are not limited to the n-type.

A plurality of insulation materials 112 extending along the first direction is sequentially provided along the second direction over a region of the substrate 111 between the first and second doping regions 311 and 312. For example, the plurality of insulation materials 112 and the substrate 111 are provided along the second direction such that they are spaced apart by a predetermined or desired distance. For example, the plurality of insulation materials 112 is provided to be spaced apart from each other along the second direction. The insulation materials 112 may include an insulator such as silicon oxide.

A plurality of pillars 113, that is, channel holes 113 are sequentially provided on a region of the substrate 111 between the first doping region 311 and the second doping region 312, and are formed to penetrate the insulation materials 112 along the second direction. A pillar may form a channel hole electrically connecting memory cells. For example, the plurality of channels holes 113 may penetrate the insulation materials 112 to contact with the substrate 111.

Each of the channel holes 113 may be composed of a plurality of materials. For instance, a surface layer 114 of each channel hole 113 may include a silicon material having a first type. For example, the surface layer 114 of each channel hole 113 may include a silicon material which is doped with the same type as that of the substrate 111. Hereinafter, it is assumed that the surface layer 114 of each channel hole 113 includes p-type silicon. However, the surface layer 114 of each channel hole 113 is not limited to include p-type silicon.

An inner layer 115 of each channel hole 113 may be formed of an insulation material. For example, the inner layer 115 of each channel hole 113 may be filled with an insulation material such as silicon oxide.

In a region between the first and second doping regions 311 and 312, an insulation layer 116 is provided along exposed surfaces of the insulation materials 112, the channel holes 113, and the substrate 111. For example, the thickness of the insulation material 116 may be less than a half of the distance between the insulation materials 112. That is, a region, in which any material other than the insulation materials 112 and the insulation layer 116 is disposed, may be provided between the insulation layer 116 provided on an undersurface of the first insulation material of the insulation materials 112 and the insulation layer 116 provided on a top surface of the second insulation material under the first insulation material.

In the region between the first and second doping regions 311 and 312, conductive materials 211 to 291 are provided on an exposed surface of the insulation layer 116. For example, the conductive material 211 extending along the first direction is provided between the substrate 111 and the insulation layer 112 adjacent thereto. More specifically, the conductive material 211 extending along the first direction is provided between the substrate 111 and the insulation layer 116 disposed under the insulation material 112 adjacent to the substrate 111.

A conductive material extending along the first direction may be provided between the insulation layer 116 on a top surface of a specific insulation material among the insulation materials 112 and the insulation layer 116 disposed on an undersurface of an insulation layer provided on top of the specific insulation material. For example, a plurality of conductive materials 221 to 281 extending along the first direction is provided between the insulation materials 112. Also, the conductive material 291 extending along the first direction is provided on the insulation materials 112. That is, the conductive materials 211 to 291 extending along the first direction may be a metallic material, and the conductive materials 211 to 291 extending along the first direction may be a conductive material such as polysilicon.

A structure identical to a structure disposed on the first and second doping regions 311 and 312 may be provided in a region between the second and third doping regions 312 and 313. For example, the plurality of insulation materials 112 extending along the first direction, the plurality of channel holes 113 which are sequentially arranged in the first direction and penetrate the plurality of insulation materials 112 in the third direction, the insulation layer 116 provided on exposed surfaces of the plurality of insulation materials 112 and the plurality of pillars 112, and the plurality of conductive materials 212 to 292 extending along the first direction may be provided in the region between the second and third doping regions 312 and 313.

A structure identical to a structure disposed on the first and second doping regions 311 and 312 may be provided in a region between the third and fourth doping regions 313 and 314. That is, the plurality of insulation materials 112 extending along the first direction, the plurality of channel holes 113 which are sequentially arranged in the first direction and penetrate the plurality of insulation materials 112 in the third direction, the insulation layer 116 provided on exposed surfaces of the plurality of insulation materials 112 and the plurality of pillars 112, and the plurality of conductive materials 213 to 293 extending along the first direction may be provided in the region between the third and fourth doping regions 313 and 314.

Drains 320 are respectively provided on the plurality of channel holes 113. Exemplarily, the drains 320 may include a silicon material doped with a second type material. For example, the drains 320 may include a silicon material doped with an n-type material. Hereinafter, it is assumed that the drains 320 include a silicon material doped with an n-type material. However, the drains 320 are not limited to include n-type silicon materials. In example embodiments, a width of each drain 320 may be wider than that of a corresponding channel hole 113. For example, each drain 320 is provided on a top surface of the corresponding channel hole 113 in a pad shape.

Conductive materials 331 to 333 extending in the third direction are respectively connected on the drains 320. The conductive materials 331 to 333 are sequentially disposed along the first direction. The conductive materials 331 to 333 are respectively connected to the drains 320 in the corresponding region. Thus, the drains 320 and the second conductive material 333 extending along the third direction may be connected to each other through respective contact plugs. The conductive materials 331 to 333 extending along the third direction may be a metallic material, and the conductive materials 331 to 333 extending along the third direction may be a conductive material such as polysilicon.

In FIGS. 5 and 6, each of the channel holes 113 may form a string together with an adjacent region of the insulation layer 116 and adjacent regions of the plurality of conductive materials 211 to 291, 212 to 292, and 213 to 293. For example, each channel hole 113 may form a NAND string NS together with an adjacent region to the insulation layer 116 and adjacent regions of the first conductive materials 211 to 291, 212 to 292, and 213 to 293 extending along the first direction. The NAND string NS may include a plurality of transistor structures TS.

The memory block BLK1 includes a plurality of channel holes 113. That is, the memory block BLK1 may include a plurality of NAND strings NS. More specifically, the memory block BLK1 may include a plurality of NAND strings NS extending along a second direction (or, a direction perpendicular to a substrate).

Each of the NAND strings NS may include transistor structures TS which are disposed in a second direction. At least one of the transistor structures TS of each NAND string NS may act as a string select transistor SST. At least one of the transistor structures TS of each NAND string may act as a ground select transistor GST.

The gates (or control gates) may correspond to the conductive materials 211 to 291, 212 to 292, and 213 to 293 extending along the first direction. That is, the gates (or control gates) may form word lines WL extending along the first direction and at least two select lines (e.g., at least one string selection line SSL and at least one ground selection line GSL).

The conductive materials 331 to 333 extending along the third direction may be connected to one ends of the NAND strings NS. For example, the conductive materials 331 to 333 extending along the third direction may act as bit lines BL. That is, in one memory block BLK1, one bit line BL may be connected to the plurality of NAND strings.

The second type doping regions 311 to 314 extending along the first direction may be provided at the other ends of the NAND strings NS. The second type doping regions 311 to 314 extending along the first direction may act as common source lines CSL.

From the foregoing it can be seen that the memory block BLK1 may include the plurality of NAND strings NS extending along a direction (second direction) perpendicular to the substrate 111, and may operate as a NAND flash memory block (e.g., charge trap type) in which the NAND strings NS are connected to one bit line BL.

In FIGS. 5 to 6, it has been described that the conductive materials 211 to 291, 212 to 292, and 213 to 293 extending along the first direction are provided on nine layers. However, the first conductive materials 211 to 291, 212 to 292, and 213 to 293 extending along the first direction are not limited to being provided on the nine layers. For example, the conductive materials extending along the first direction may be provided upon 8, 16 or more layers. That is, a NAND string may include 8, 16 or more transistors.

Referring to FIGS. 5 and 6, a diameter of a channel hole 113 increases in proportion to a distance from the substrate 111. The diameter of the channel hole 113 is irregular due to a process cause on the basis of a transistor. In FIGS. 5 and 6, there is illustrated an example where a diameter of a channel hole 113 increases in proportion to a distance from the substrate 111. However, the inventive concept is not limited thereto. The diameter of the channel hole 113 is varied according to a memory cell. A setup time of a word line voltage is variable according to a diameter of the channel hole 113. This will be more fully described with reference to FIG. 8.

Figure 7:
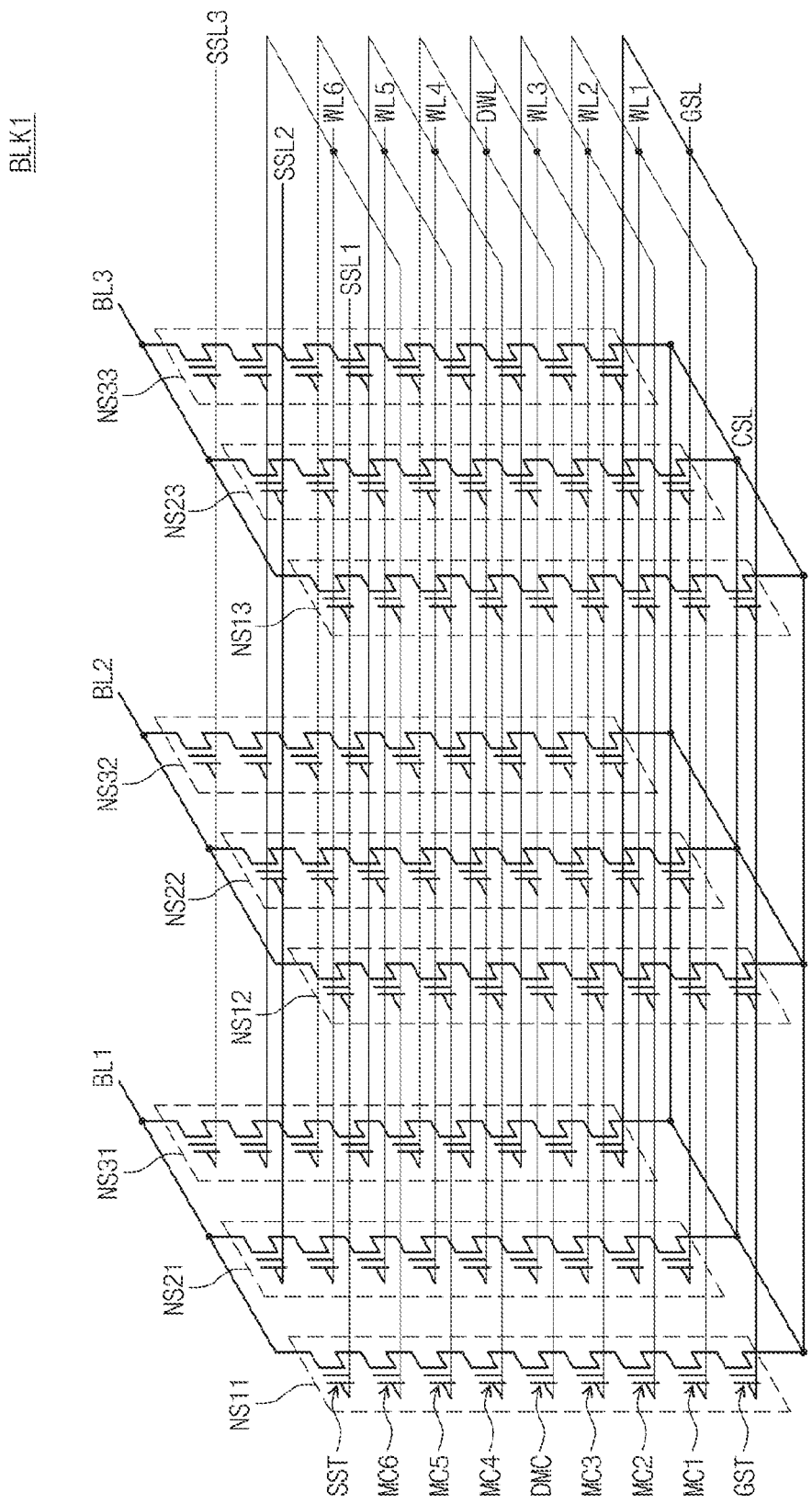
FIG. 7 is an equivalent circuit diagram for a memory block of the memory cell array described in FIGS. 5 and 6.

FIG. 7 is an equivalent circuit diagram for the memory block BLK1 shown in FIGS. 5 to 6. Referring to FIGS. 5, 6 and 7, NAND strings NS11, NS21 and NS31 are provided between a first bit line BL1 and a common source line CSL. NAND strings NS12, NS22 and NS32 are provided between a second bit line BL2 and the common source line CSL. NAND strings NS13, NS23 and NS33 are provided between a third bit line BL3 and the common source line CSL. The third bit line BL3 may correspond to a conductive material 333 extending along a third direction.

A string select transistor SST of each NAND string NS may be connected to a corresponding bit line BL. A ground select transistor GST of each NAND string NS may be connected to the common source line CSL. Memory cells MC may be provided between the string selection transistor SST and the ground selection transistor GST of each NAND string NS.

Hereinafter, the NAND strings NS may be defined in units of rows and columns. The NAND strings NS commonly connected to one bit line form one column. For example, the NAND strings NS11 to NS31 connected to the first bit line BL1 correspond to a first column. The NAND strings NS12 to NS32 connected to the second bit line BL2 correspond to a second column. The NAND strings NS13 to NS33 connected to the third bit line BL3 correspond to a third column. The NAND strings NS connected to one string select line SSL may form one row. For example, the NAND strings NS11 to NS13 connected to a first string selection line SSL1 form a first row. The NAND strings NS21 to NS23 connected to a second string selection line SSL2 form a second row. The NAND strings NS31 to NS33 connected to a third string selection line SSL3 form a third row.

A height may be defined in each NAND string NS. Exemplarily, the height of the ground selection transistor GST may be defined as 1 in each NAND string NS. In each NAND string NS, the closer to the string selection transistor SST, the higher the height of a memory cell. In each NAND string NS, the height of the memory cell MC6 adjacent to the string selection transistor SST may be defined as 7.

The string selection transistors SST of the NAND strings NS of the same row may share the string select line SSL. The string selection transistors SST of the NAND strings NS in different rows may be connected with different string select lines SSL1, SSL2, and SSL3, respectively.

The memory cells MC having the same height in the NAND strings NS of the same row share the word line WL. The word lines WL of the NAND strings NS which have the same height and correspond to different rows are commonly connected. Dummy memory cells DMC having the same height in the NAND strings NS of the same row may share a dummy word line DWL. The dummy word lines DWL of the NAND strings NS which have the same height and are connected to dummy memory cells DMC of the NAND strings NS in different rows are commonly connected.

The word lines WL or the dummy word lines DWL may be commonly connected on layers where conductive materials 211 to 291, 212 to 292, and 213 to 293 extending in the first direction are provided.

The conductive materials 211 to 291, 212 to 292, and 213 to 293 extending in the first direction may be connected to an upper layer via a contact. The conductive materials 211 to 291, 212 to 292, and 213 to 293 extending in the first direction may be connected in common at the upper layer. Ground select transistors GST of the NAND strings NS of the same row share a ground selection line GSL. The ground selection transistors GST of the NAND strings NS in different rows share the ground select line GSL. That is, the NAND strings NS11 to NS13, NS21 to NS23, and NS31 to NS33 are connected in common to the ground selection line GSL.

The common source line CSL is commonly connected to all the NAND strings NS. For example, the first to fourth doping regions 311 to 314 may be connected at an active region of the substrate 111. For example, the first to fourth doping regions 311 to 314 may be connected to an upper layer via a contact. The first to fourth doping regions 311 to 314 may be connected in common at the upper layer.

As illustrated in FIG. 7, the word lines WL having the same height are commonly connected. Therefore, when the word line WL with a specific height is selected, all of the NAND strings NS connected to the selected word line WL may be selected. The NAND strings NS of different rows may be connected to different string selection lines SSL. Accordingly, among the NAND strings NS connected to the same word line WL, the NAND strings NS of the unselected row may be electrically isolated from the bit lines BL1 to BL3. That is, a row of the NAND strings NS may be selected by selecting the string selection lines SSL1 to SSL3. The NAND strings NS of the selected row may be selected by the column unit by selecting the bit lines BL1 to BL3.

With reference to the exemplary 3D memory cell array 1110 shown in FIGS. 5, 6 and 7 and as previously described with reference to FIGS. 1 and 3, the time control unit 1165 may be used to change a word line setup time in relation to a read voltage. The time control unit 1165 may also be used to determine a word line setup time based on a word line setup time difference between first and second read voltages. Alternately or additionally, the time control unit 1165 may be used to determine a word line setup time in relation to a verification voltage provided to a word line based on pass/fail information. And since word line setup time related to a read voltage or verification voltage is dependent on the effective diameter of the channel hole traversing a 3D memory cell array, the time control unit 1165 may be used to determine a word line setup time in relation to read voltage(s) or verification voltage(s) as applied at a particular physical location along the word line.

Figure 8:
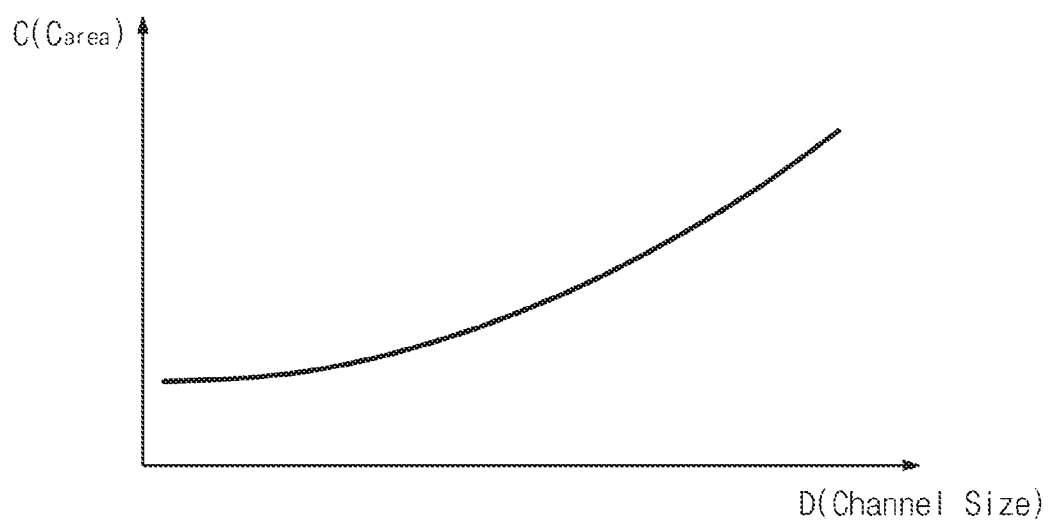
FIG. 8 is a graph showing a relationship between a diameter of a channel hole and area capacitance.

FIG. 8 is a graph illustrating a relationship between the diameter (D) of a channel hole in a 3D memory cell array and its corresponding area capacitance (C). Referring collectively to FIGS. 5, 6, 7, and 8, diameters of each channel hole 113 respectively corresponding to each of the word lines will usually be different from one another. The larger the diameter for the channel hole 113 is the greater the corresponding area capacitance. And since the associated RC delay increases with an increase in area capacitance, the word line setup time for word lines having relatively large diameters will be longer than those for word lines having relatively smaller diameters. Thus, a time control unit 1165 of FIGS. 1 and 3 may be used to determine respective word line setup times according to the respective diameters of the channel hole 113 across a 3D memory cell array.

Thus, if a diameter of the channel hole 113 is larger than a reference diameter, the time control unit 1165 may determine that the setup time for a particular word line is longer than a reference word line voltage setup time corresponding to the reference diameter. Accordingly, when the diameter of the channel hole 113 is larger than the reference diameter, the time control unit 1165 may establish a relatively longer word line setup time for a corresponding word line, and if the diameter of the channel hole 113 is smaller than the reference diameter, the time control unit 1165 may establish a relatively shorter word line setup time for the corresponding word line.

As noted above, a "word line voltage" may be a program voltage, a read voltage or a verification voltage. However, regardless of the particular form of the word line voltage, a corresponding word line setup time will vary in a 3D memory cell array according to the physical location of the word line, and/or its constituent physical nature (e.g., the diameter of its channel hole). Further, having an accurate understanding of appropriate word line setup times in relation to particular word line voltages allows the nonvolatile memory device 1100 to be operated with great efficiency.

Figure 9:
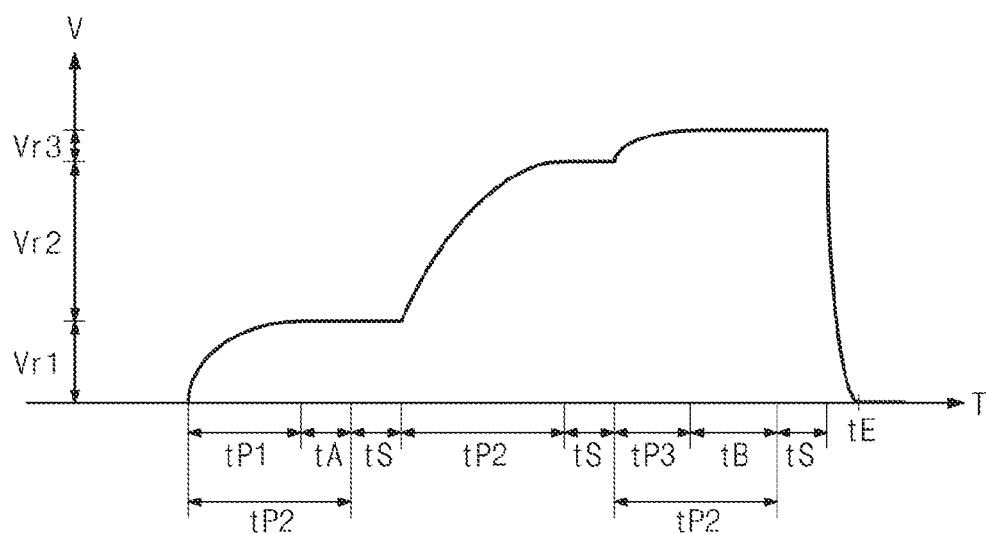
FIGS. 9 and 10 are timing diagrams showing a setup time for a read voltage provided to a memory cell array according to an embodiment of the inventive concept.
Figure 10:
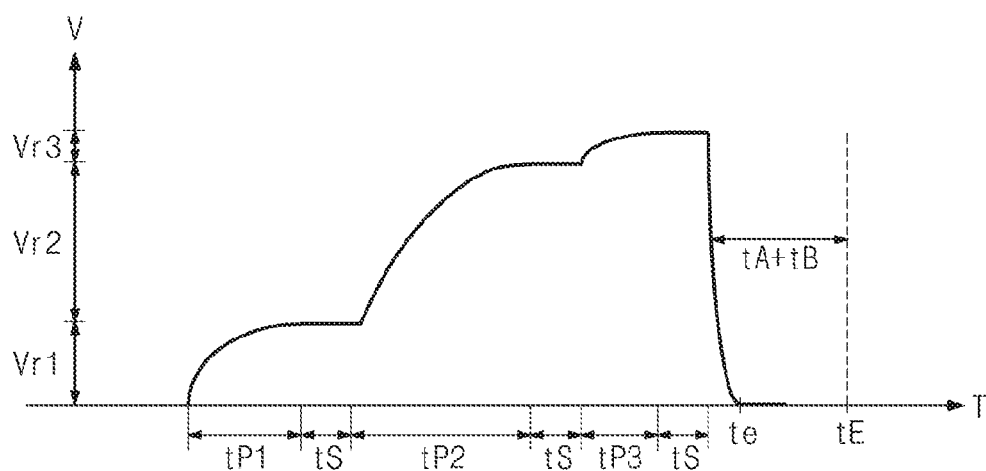

FIGS. 9 and 10 are diagrams further illustrating word line setup times related to a read voltage provided to a memory cell array according to an embodiment of the inventive concept. In FIGS. 9 and 10, the horizontal axis indicates time and the vertical axis indicates a voltage level for the read voltage.

Referring to FIGS. 4, 9, and 10, a plurality of read voltages may be applied to a memory cell array in accordance with one or more program state(s). More particularly, a first read voltage Vr1, a second read voltage Vr2, and a third read voltage Vr3 are applied to a particular word line. The second read voltage Vr2 follows the first read voltage Vr1 and is higher than the first read voltage Vr1. The third read voltage Vr3 follows the second read voltage Vr2 and is higher than the second read voltage Vr2.

FIG. 9 shows a case wherein the read voltages have about the same word line setup time. Referring to FIG. 9, the first, second and third read voltages Vr1, Vr2, and Vr3 result in about the same word line setup times tP2.

More particularly, when the first read voltage Vr1 is applied, a first sensing pre-charge time tP1 and a pre-charge voltage hold time tA are required. Thus, a word line setup time tP2 of the first read voltage Vr1 may correspond to a sum tP2 of the first sensing pre-charge time tP1 and the pre-charge voltage hold time tA. When the second read voltage Vr2 is applied, a second sensing pre-charge time tP2 is required, while a pre-charge voltage hold time tA is not required. Likewise, when the third read voltage Vr3 is applied, a third sensing pre-charge time tP3 and a pre-charge voltage hold time tB are required. Thus, a word line setup time tP2 of the third read voltage Vr3 may correspond to a sum tP2 of the third sensing pre-charge time tP3 and the pre-charge voltage hold time tB. As illustrated in FIG. 9, in the event that a word line setup time tP2 is equally set, the pre-charge hold times tA and tB are respectively required after a sensing pre-charge operation is ended.

In the event that read operations are respectively executed using the first, second and third read voltages Vr1, Vr2 and Vr3, sensing times tS required after a word line is set up are equal to each other.

Referring to FIGS. 3 and 10, a word line setup time may—in contrast to the example shown in FIG. 9—be variable according to different read voltages. Nonetheless, the time control unit 1165 shown in FIGS. 1 and 3 may be used to efficiently determine respective word line setup times for different read voltages, or in relation to a read voltage difference.

More particularly, a word line setup time of the first read voltage Vr1 is a first sensing time tP1, and is a time (tP2-tA) obtained by subtracting a pre-charge hold time tA from tP2. When the second voltage Vr2 following the first read voltage Vr1 is applied, the time control unit 1165 determines a word line setup time of the second read voltage Vr2, based on a difference between the first read voltage Vr1 and the second read voltage Vr2. Since a difference between the first read voltage Vr1 and the second read voltage Vr2 is larger than a reference value, the time control unit 1165 determines a word line setup time of the second read voltage Vr2 to be longer than that of the first read voltage Vr1.

Also, a word line setup time of the third read voltage Vr3 is set to a third read voltage pre-charge time tP3 shown in FIG. 9, and is a time (tP2-tB) obtained by subtracting a pre-charge hold time tB from tP2. When the third voltage Vr3 following the second read voltage Vr2 is applied, the time control unit 1165 determines a word line setup time of the third read voltage Vr3, based on a difference between the second read voltage Vr2 and the third read voltage Vr3. Since a difference between the second read voltage Vr2 and the third read voltage Vr3 is smaller than the reference value, the time control unit 1165 determines a word line setup time of the third read voltage Vr3 to be shorter than that of the second read voltage Vr2.

Referring to FIGS. 9 and 10, if the time control unit 1165 determines a word line setup time to be variable according to a read voltage, the time taken to perform a read operation is reduced by a time (tA+tB) corresponding to a sum of pre-charge hold times tA and tB. The "read speed", that is, a time taken to perform a read operation using a given read voltage may be improved by variably setting a word line setup time according to a read voltage difference. Thus, the performance of a nonvolatile memory device 1100 may be improved.

As described above, the time control unit 1165 variably sets a word line setup time of a read voltage according to an increment of each of a plurality of read voltages. The increments of the read voltages may be determined according to a state ordering of data that is established when the constituent nonvolatile memory device is fabricated. Hence, the time control unit 1165 may determine a read voltage applying time according to a predetermined state ordering.

Figure 11:
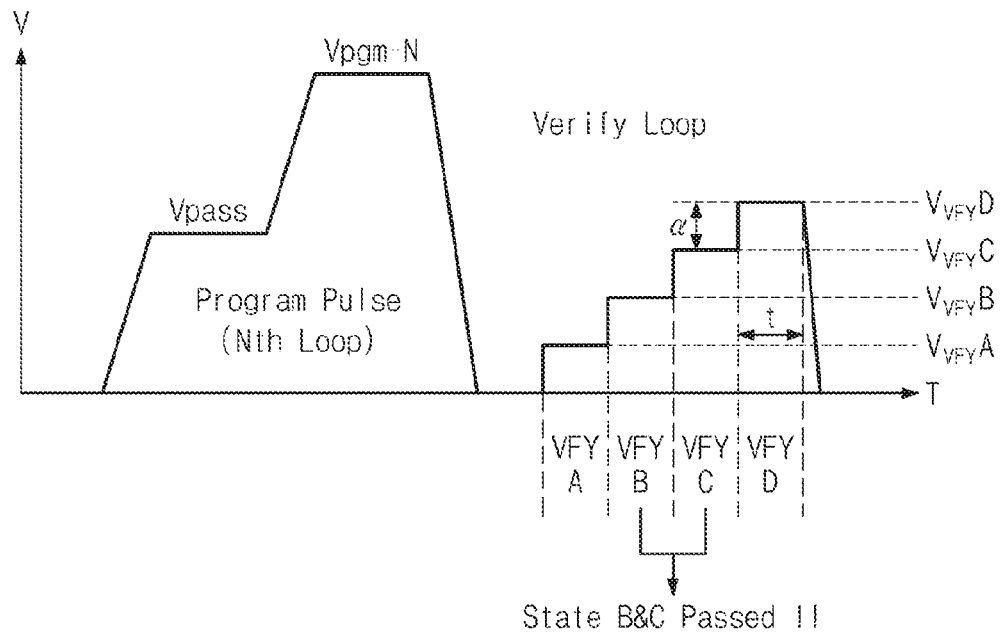
FIGS. 11 and 12 are timing diagrams illustrating a word line applying time for a verification voltage according to another embodiment of the inventive concept.
Figure 12:
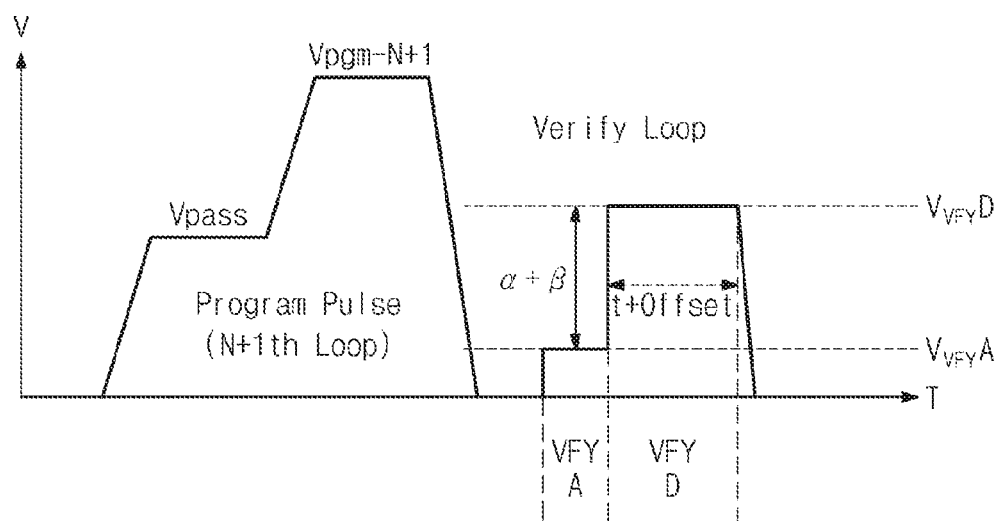

FIGS. 11 and 12 are diagrams illustrating a word line applying time for a verification voltage that is used to verify the programming of data following a program operation according to another embodiment of the inventive concept.

Referring to FIGS. 3 and 11, during the program operation, a voltage generator 1150 provides a pass voltage Vpass and a program voltage Vpgm_N to a first word line 1111, and then sequentially provides a plurality of, for example, first to fourth verification voltages VvfyA, VvfyB, VvfyC, and VvfyD. Levels of the first to fourth verification voltages VvfyA, VvfyB, VvfyC, and VvfyD are sequentially increased by the same increment α, while they have the same word line setup time t. It is assumed that during a verification operation, the second and third verification voltages VvfyB and VvfyC are passed. In FIG. 11, it is assumed that a pass voltage Vpass and a program voltage Vpgm_N are defined as an Nth pulse applied at an Nth loop. After a program operation is executed using the Nth pulse, the voltage generator 1150 provides the pass voltage Vpass and a program voltage Vpgm_N+1 to the first word line 1111. Afterwards, the voltage generator 1150 provides first and fourth verification voltages VvfyA and VvfyD failed at the Nth loop to the first word line 1111. A difference between the first and fourth verification voltages VvfyA and VvfyD corresponds to a value (α+β) being a sum of α and β.

As may be understood from FIG. 12, a difference between the first and fourth verification voltages VvfyA and VvfyD is larger by β than being an increment α of a verification voltage. The time control unit 1165 may determine the β value and determine an offset group related to the β value, where the β value may be designated as a pure verification voltage increment. The time control unit 1165 may then be used to determine an offset time corresponding to an offset group by referring to a lookup table. Thus, the time control unit 1165 may be used to determine a word line setup time by adding an offset time of each group.

In FIG. 12, when the fourth verification voltage VvfyD is provided, the time control unit 1165 may determine a word line setup time of the fourth verification voltage VvfyD to be longer by an offset than that of the first verification voltage VvfyA. One example of a lookup table will be described in some additional detail with reference to FIG. 14.

FIG. 13 is a flow chart summarizing in one example a method of determining a word line setup time in relation to a verification voltage according to an embodiment of the inventive concept. Referring to FIGS. 12 and 13, the time control unit 1165 may be used to determine a β value that is designated as a pure verification voltage increment by comparing a current verification voltage with a previous verification voltage (S110). Then, the time control unit 1165 may be used to determine an offset group based on the β value (S120). For example, the time control unit 1165 may search and determine an offset time corresponding to an offset group by checking a lookup table (S130). Then, the time control unit 1165 may be used to establish a word line setup time related to the verification voltage, as increased by the offset time.

FIG. 14 is a diagram showing one possible example of a lookup table that may be used to determine a word line setup time in relation to a verification voltage using (e.g.,) the approach described in relation to FIGS. 12 and 13. Referring to FIG. 14, the lookup table provides offset time information corresponding to an offset group. Thus, the lookup table provides word line setup time information in relation to a verification voltage.

In FIG. 14, the lookup table includes six (6) offset groups; 0 Group, 1 Group, 2 Group, 3 Group, 4 Group, and 5 Group, as well as offset times respectively corresponding to the six offset groups. For the offset group 0 Group, the offset time is '0'. For the offset group 1 Group, the offset time is a predetermined time 't'. Thus, a word line setup time for a corresponding verification voltage may be set to 2t being the sum of time 't' and offset time 't'. For the offset group 2 Group, the offset time is '2t'. Thus, a word line setup time for a corresponding verification voltage may be set to 3t being the sum of '2t' and offset time 't'. In the remaining offset groups 3 Group through 5 Group, a word line setup time for a corresponding verification voltage may be set to a time obtained by adding a corresponding offset time to 't'.

The lookup table of FIG. 14 may be stored in a memory or register of the control logic 1160. The offsets populating the lookup table may be established when the nonvolatile memory device is fabricated.

Figure 15:
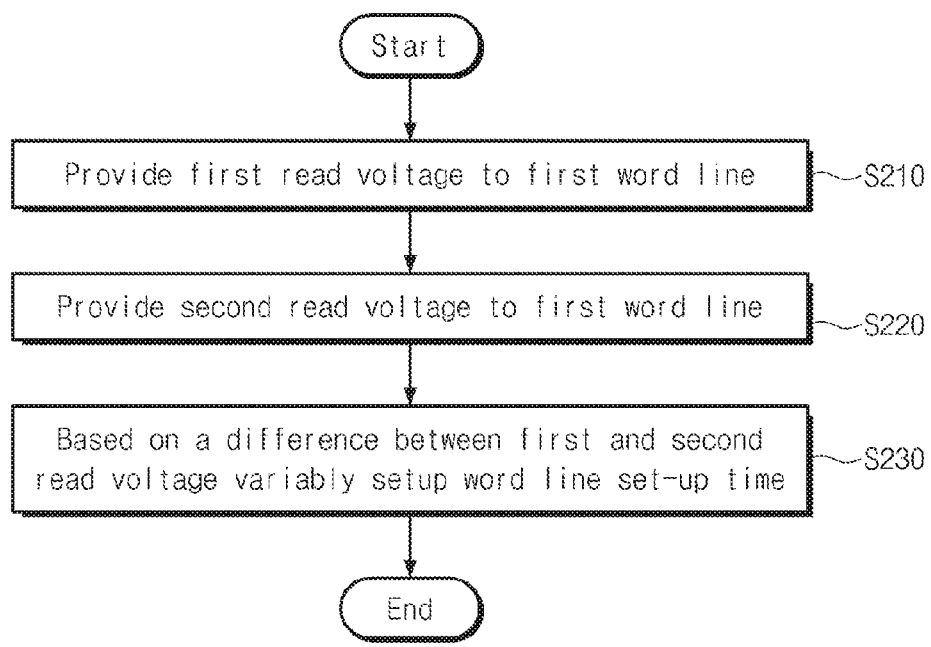
FIG. 15 is a flow chart summarizing a word line setup time setting method performed by a time control unit during a read operation according to an embodiment of the inventive concept.

FIG. 15 is a flow chart generally summarizing a method that may be used to determine a word line setup time in relation to first and second read voltages applied during a read operation according to an embodiment of the inventive concept.

With reference to the nonvolatile memory device of FIGS. 3 and 4, the voltage generator 1150 may be used to provide a first read voltage to the first word line 1111 (S210). Then, the voltage generator 1150 may be used to provide the first word line 1111 with a second read voltage (S220). The time control unit 1165 then variably determines a word line setup time in accordance with a difference in word line setup times respectively associated with the first and second read voltages (S230).

For example, if the first read voltage has a voltage level lower than a voltage level for the second read voltage, a difference between the first read voltage and the second read voltage may be determined according to a state ordering used by the nonvolatile memory device 1100. If a difference between the first and second read voltages is larger than a reference value, a word line applying time of the second read voltage may be set to be longer than that of the first read voltage. However, if a difference between the first and second read voltages is smaller than the reference value, a word line applying time of the second read voltage may be set to be shorter than that of the first read voltage.

Figure 16:
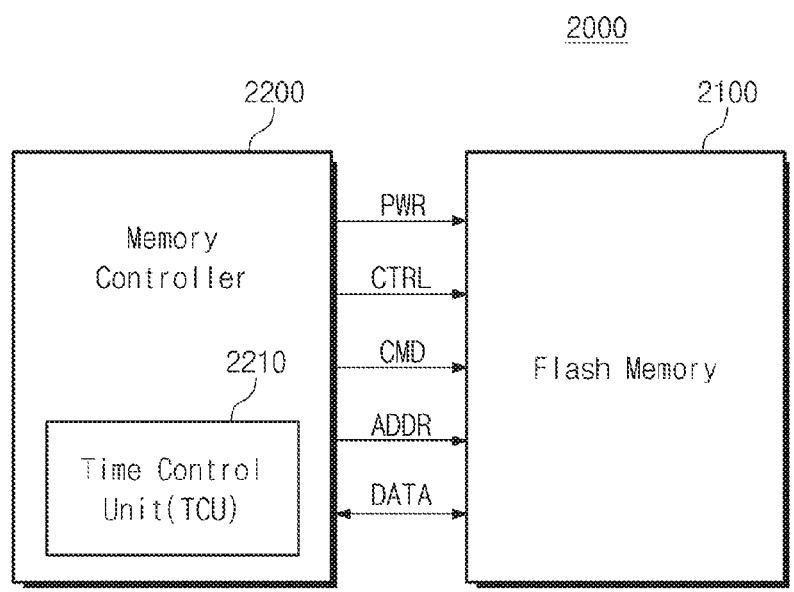
FIG. 16 is a block diagram illustrating a nonvolatile memory system according to another embodiment of the inventive concept.

FIG. 16 is a block diagram illustrating a nonvolatile memory system according to another embodiment of the inventive concept. Referring to FIG. 16, a nonvolatile memory system 2000 comprises a nonvolatile memory device 2100 and a memory controller 2200. Like a nonvolatile memory system 1000 shown in FIG. 1, the nonvolatile memory system 2000 may comprise all nonvolatile memory based data storage media such as a memory card, a USB memory, a solid state drive (SSD), and the like.

The memory controller 2200 controls an operation of the nonvolatile memory device 2100. The memory controller 2100 comprises a time control unit 2210 that is configured to set a providing time of a read voltage or a verification voltage every read or verification voltage. A time taken to perform a read operation and a verification operation is reduced by controlling the providing time of a read voltage or a verification voltage. Thus, the performance of the nonvolatile memory system 2000 is improved.

The nonvolatile memory device 2100 performs erase, write and read operations according to a control of the memory controller 2200. The nonvolatile memory device 2100 is substantially the same as that shown in FIG. 1.

Figure 17:
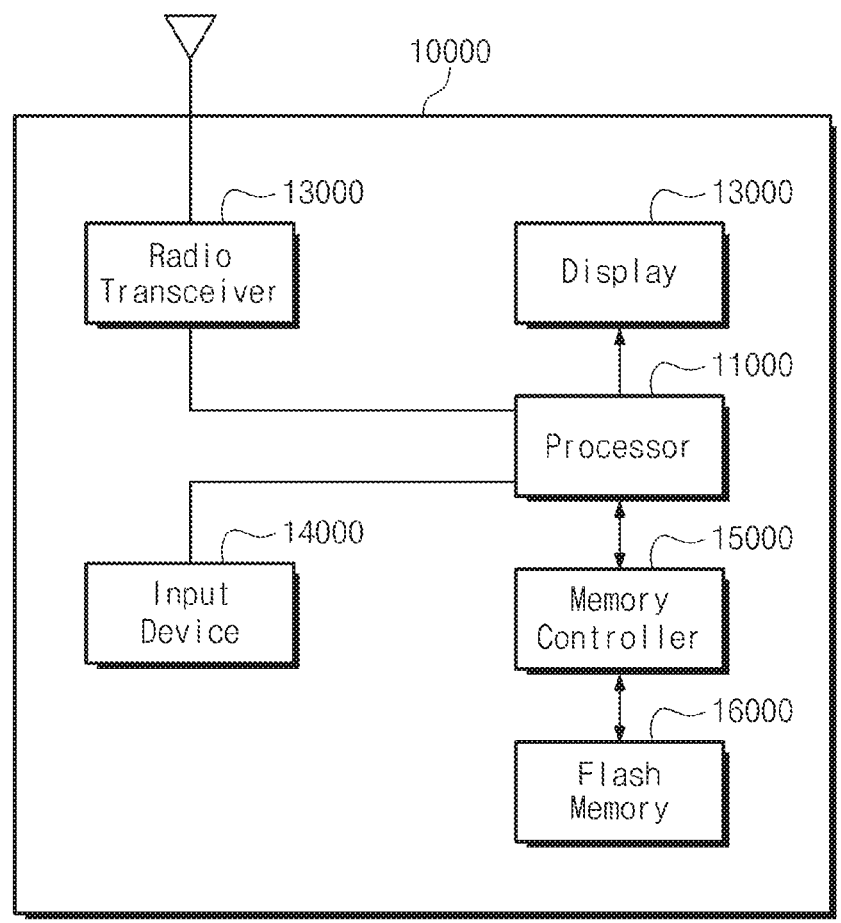
FIG. 17 is a block diagram illustrating an electronic device including a nonvolatile memory device according to an embodiment of the inventive concept.

FIG. 17 is a block diagram illustrating an electronic device 10000 including a nonvolatile memory device 16000 according to an embodiment of the inventive concept. Referring to FIG. 17, an electronic device 10000 such as a cellular phone, a smart phone, or a tablet PC may be include a flash nonvolatile memory device 16000 implemented by a flash memory device and a memory controller 15000 to control the nonvolatile memory device 16000.

The nonvolatile memory device 16000 is a nonvolatile memory device shown in FIGS. 1 and 3. Also, the memory controller 15000 is a memory controller shown in FIG. 1. The memory controller 15000 is controlled by a processor 11000 that controls an overall operation of the electronic device 10000.

Data stored at the nonvolatile memory device 16000 is displayed through a display 13000 according to a control of the memory controller 15000 that operates according to a control of the processor 11000.

A radio transceiver 12000 exchanges a radio signal through an antenna. For example, the radio transceiver 12000 converts a radio signal received through the antenna into a signal capable of being processed by the processor 11000. Thus, the processor 11000 processes a signal from the radio transceiver 12000, and stores the processed signal in the nonvolatile memory device 16000. Or, the processor 11000 displays the processed signal through the display 13000. The radio transceiver 12000 converts a signal output from the processor 11000 and outputs the converted signal to the external device through the antenna.

An input device 14000 is a device that receives a control signal for controlling an operation of the processor 11000 or data to be processed by the processor 11000, and is implemented by a pointing device such as a touch pad or a computer mouse, a key pad, or a keyboard. The processor 11000 controls the display 13000 such that data from the nonvolatile memory device 16000, a radio signal from the radio transceiver 12000 or data from the input device 14000 is displayed through the display 13000.

Figure 18:
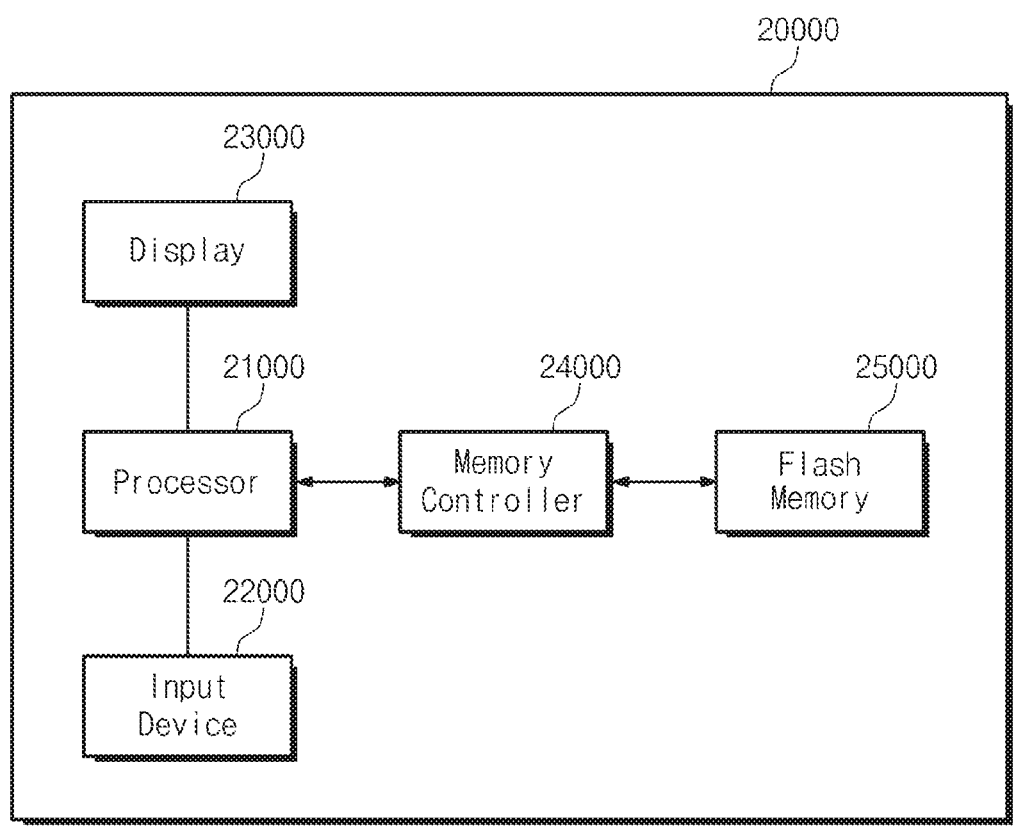
FIG. 18 is a block diagram illustrating an electronic device including a memory controller and a nonvolatile memory device, according to another embodiment of the inventive concept.

FIG. 18 is a block diagram illustrating an electronic device 20000 including a memory controller 24000 and a nonvolatile memory device 25000, according to another embodiment of the inventive concept. Referring to FIG. 18, an electronic device 20000 may be implemented by a data processing device such as a personal computer, a tablet computer, a net-book, an e-reader, a PDA (Personal Digital Assistant), a PMP (Portable Multimedia Player), an MP3 player, or an MP4 player, and includes a nonvolatile memory device 25000 (e.g., a flash memory device) and a memory controller 24000 to control an operation of the nonvolatile memory device 25000.

The nonvolatile memory device 25000 is a nonvolatile memory device shown in FIGS. 1 and 3. Also, the memory controller 24000 is a memory controller shown in FIG. 1. The electronic device 20000 includes a processor 21000 that controls an overall operation of the electronic device 20000. The memory controller 24000 is controlled by the processor 21000. The processor 21000 displays data stored at the nonvolatile memory device 25000 through a display 23000 according to an input signal generated by an input device 22000. For example, the input device 22000 is implemented by a pointing device such as a touch pad or a computer mouse, a key pad, or a keyboard.

Figure 19:
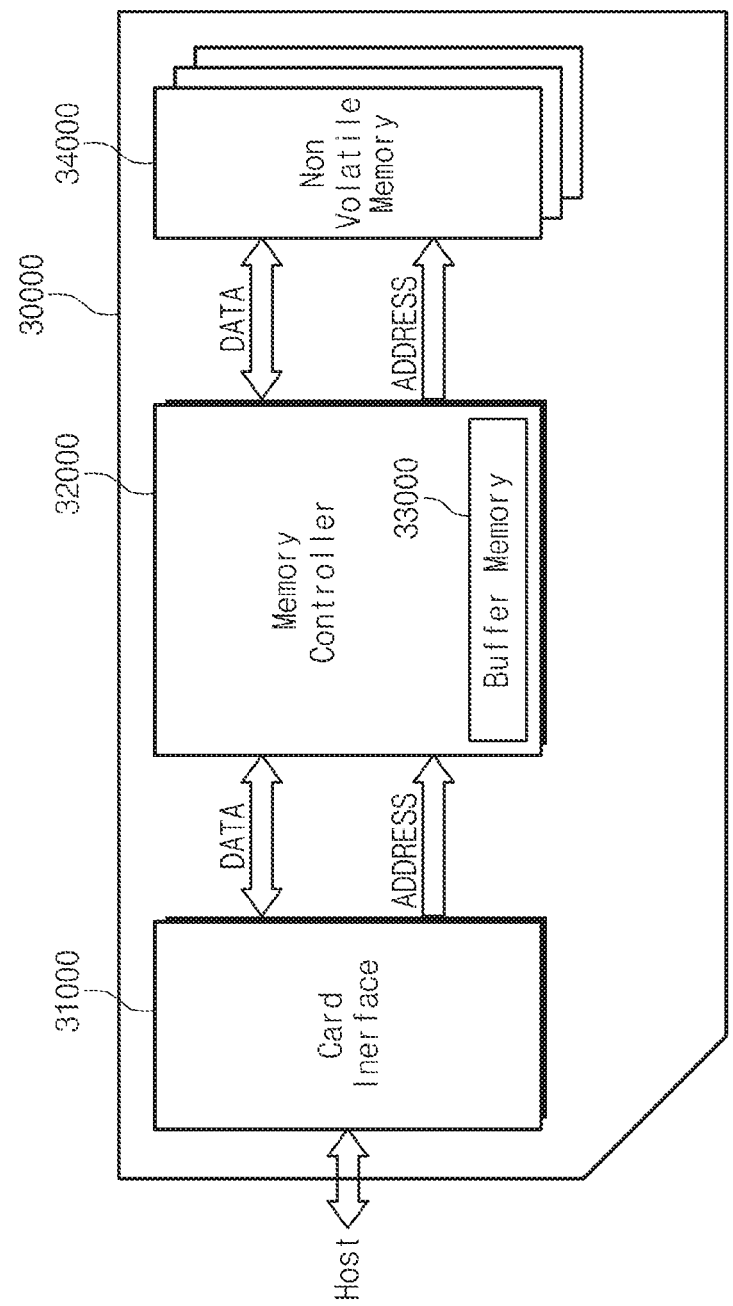
FIG. 19 is a block diagram illustrating an electronic device including a nonvolatile memory device, according to still another embodiment of the inventive concept.

FIG. 19 is a block diagram illustrating an electronic device 30000 including a nonvolatile memory device 34000, according to still another embodiment of the inventive concept. Referring to FIG. 19, an electronic device 30000 includes a card interface 31000, a memory controller 32000, and a nonvolatile memory device 34000 (e.g., a flash memory device).

The electronic device 30000 exchanges data with a host through the card interface 31000. The card interface 31000 may be an SD (Secure Digital) card interface or an MMC (Multi-Media Card) interface. However, the inventive concept is not limited thereto. The card interface 31000 interfaces data exchange between the host and the memory controller 32000 according to the communications protocol of the host capable of communicating with the electronic device 30000.

The memory controller 32000 controls an overall operation of the electronic device 30000, and control data exchange between the card interface 31000 and the nonvolatile memory device 34000. A buffer memory 33000 of the memory controller 32000 buffers data transferred between the card interface 31000 and the nonvolatile memory device 34000.

The memory controller 32000 is connected to the card interface 31000 and the nonvolatile memory device 34000 through a data bus DATA and an address bus ADDRESS. According to an embodiment of the inventive concept, the memory controller 32000 receives an address of data to be read or written from the card interface 31000 through the address bus ADDRESS to send it to the nonvolatile memory device 34000.

Also, the memory controller 32000 receives or transfers data to be read or written through the data bus DATA connected to the card interface 31000 or the nonvolatile memory device 34000.

The nonvolatile memory device 34000 is a nonvolatile memory device shown in FIGS. 1 and 3. Also, the memory controller 32000 is a memory controller shown in FIG. 1.

When the electronic device 30000 is connected to a host such as a PC, a tablet PC, a digital camera, a digital audio player, a mobile phone, console video game hardware or a digital set-top box, the host may exchange data stored in the nonvolatile memory device 34000 through the card interface 31000 and the memory controller 32000.

Figure 20:
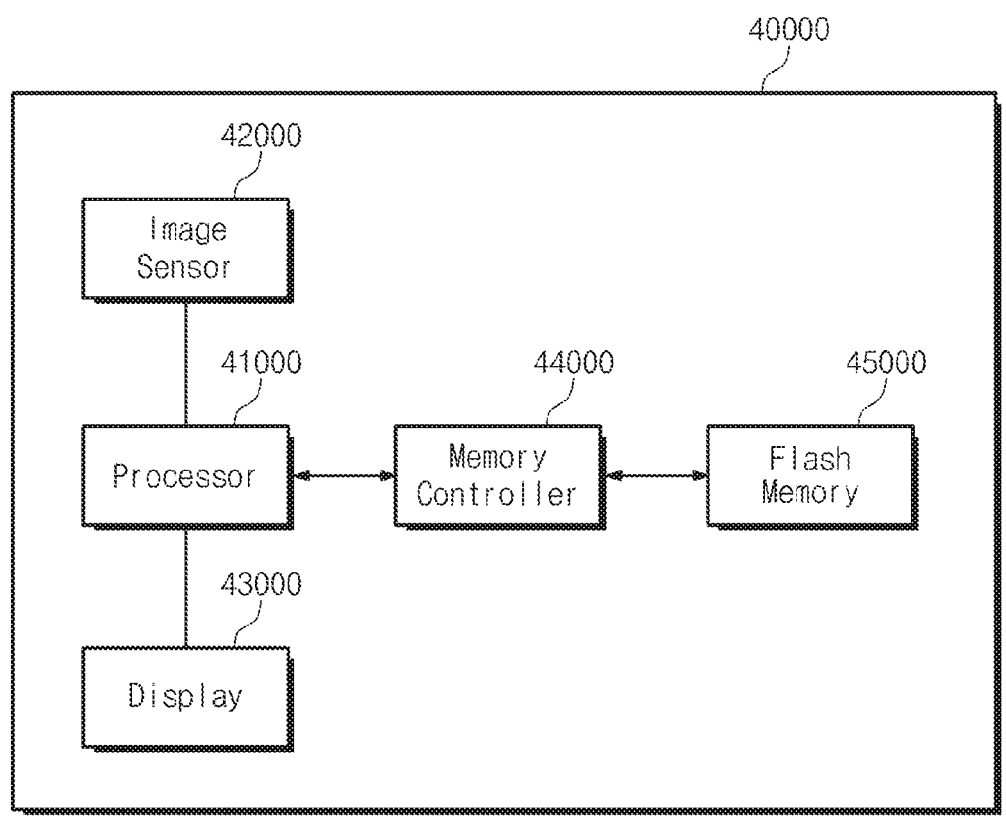
FIG. 20 is a block diagram illustrating an electronic device including a memory controller and a nonvolatile memory device, according to a further embodiment of the inventive concept.

FIG. 20 is a block diagram illustrating an electronic device including a memory controller and a nonvolatile memory device, according to a further embodiment of the inventive concept. Referring to FIG. 20, an electronic device 40000 includes a nonvolatile memory device 45000 (e.g., a flash memory device), a memory controller 44000 to control a data processing operation of the nonvolatile memory device 45000, and an image sensor 41000 to control an overall operation of the electronic device 40000.

The nonvolatile memory device 45000 is a nonvolatile memory device shown in FIGS. 1 and 3. Also, the memory controller 44000 is a memory controller shown in FIG. 1.

An image sensor 42000 of the electronic device 40000 converts an optical signal into a digital signal, and the converted digital signal is stored in the nonvolatile memory device 45000 under a control of the processor 41000. Or, the converted digital signal is displayed through a display 43000 under a control of the processor 41000.

Figure 21:
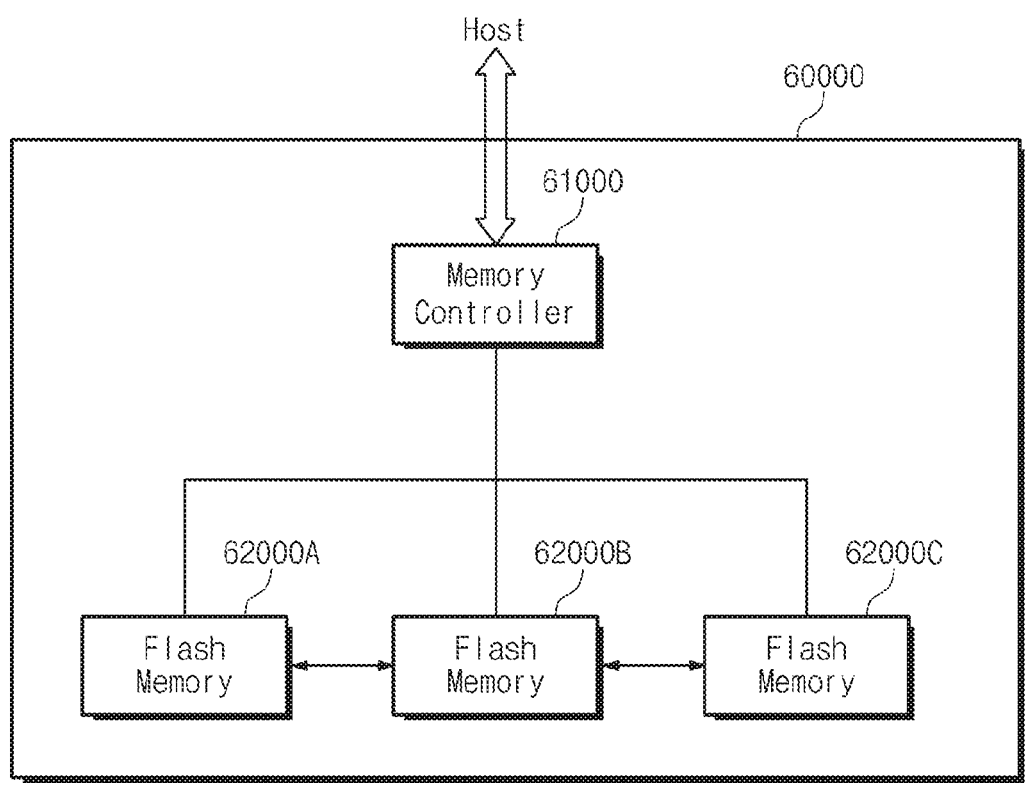
FIG. 21 is a block diagram illustrating an electronic device 60000 including a memory controller and nonvolatile memory devices, according to yet another embodiment of the inventive concept.

FIG. 21 is a block diagram illustrating an electronic device 60000 including a memory controller 61000 and nonvolatile memory devices 62000A, 62000B, and 62000C, according to yet another embodiment of the inventive concept.

Referring to FIG. 21, an electronic device 60000 is implemented by a data storage device such as a solid state drive (SSD). The electronic device 60000 includes nonvolatile memory devices 62000A, 62000B, and 62000C and a memory controller 61000 to control a data processing operation of each of the nonvolatile memory devices 62000A, 62000B, and 62000C.

The electronic device 60000 is implemented by a memory system or a memory module. Each of the nonvolatile memory devices 62000A, 62000B, and 62000C is a nonvolatile memory device shown in FIGS. 1 and 3. Also, the memory controller 61000 is a memory controller shown in FIG. 1. The memory controller 61000 is implemented outside or inside electronic device 60000 according to embodiments.

Figure 22:
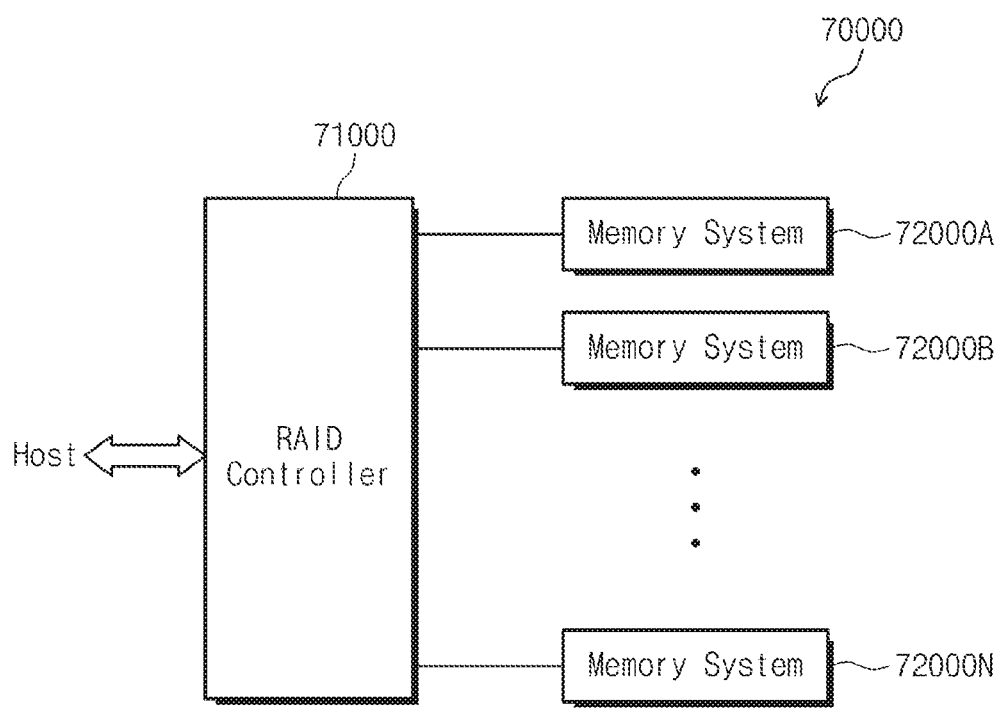
FIG. 22 is a block diagram illustrating a data processing system including an electronic device illustrated in FIG. 21.

FIG. 22 is a block diagram illustrating a data processing system including an electronic device illustrated in FIG. 21. Referring to FIGS. 21 and 22, a data storage device 70000 is implemented by a RAID (Redundant Array of Independent Disks) system. The data storage device 70000 includes a RAID controller 71000 and a plurality of memory systems 72000A to 72000N (N being a natural number).

Each of the memory systems 72000A to 72000N is an electronic device 60000 in FIG. 21. The memory systems 72000A to 72000N form an RAID array. The data storage device 70000 is implemented by a personal computer or an SSD.

During a program operation, the RAID controller 71000 outputs program data output from a host to one of the memory systems 72000A to 72000N according to one selected from a plurality of RAID levels based on RAID level information output from the host.

During a read operation, the RAID controller 71000 transfers data read from one of the memory systems 72000A to 72000N to the host according to one selected from a plurality of RAID levels based on RAID level information output from the host.

While the inventive concept has been described with reference to exemplary embodiments, it will be apparent to those skilled in the art that various changes and modifications may be made without departing from the spirit of the following claims.

What is claimed is:
1. A nonvolatile memory device, comprising:
   a memory cell array including memory cells stacked in a direction perpendicular to a substrate, and a word line connected to plural memory cells among the memory cells of the memory cell array;

a voltage generator configured to sequentially provide to the word line during a read operation a first word line pre-charge voltage during a first word line setup time, and to provide to the word line a second word line pre-charge voltage different from the first word line voltage to the word line during a second word line setup time; and a control logic including a time control unit configured to determine the second word line setup time for the second pre-charge voltage for the word line by referring to a lookup table including word line setup time information, wherein the first word line setup time for the first pre-charge voltage is a time period from when the first pre-charge voltage is first applied to the word line until a time that a first sensing operation for the word line begins, and wherein the second word line setup time for the second pre-charge voltage is a time period from when the second pre-charge voltage first is applied to the word line until a time that a second sensing operation for the word line begins, wherein the word line setup time information is based on a difference between a level of the first pre-charge voltage and a level of the second pre-charge voltage.

2. The nonvolatile memory device of claim 1, wherein the first word line setup time includes a first sensing pre-charge time followed by a first pre-charge voltage hold time.

3. The nonvolatile memory device of claim 2, wherein the second word line setup time includes a second sensing pre-charge time and wherein a second pre-charge voltage hold time following the second sensing pre-charge time is not required.

4. The nonvolatile memory device of claim 1, wherein the read operation includes a verify operation following a program operation.

5. The nonvolatile memory device of claim 1, wherein the second word line pre-charge voltage is higher than the first word line pre-charge voltage.

6. The nonvolatile memory device of claim 1, wherein the lookup table including word line pre-charge time information is stored in a register of the control logic.

7. The nonvolatile memory device of claim 1, wherein the lookup table including word line pre-charge time information is established when the nonvolatile memory device is fabricated.

8. The nonvolatile memory device of claim 1, wherein the lookup table including word line pre-charge time information is updated after the nonvolatile memory device is fabricated.

9. The nonvolatile memory device of claim 1, wherein the first sensing operation is an operation for determining a program state of each of the plural memory cells using the first word line pre-charge voltage, and the second sensing operation is an operation for determining a program state of each of the plural memory cells using the second word line pre-charge voltage.

* * * * *